US006945786B2

(12) United States Patent
Ammar et al.

(10) Patent No.: US 6,945,786 B2
(45) Date of Patent: *Sep. 20, 2005

(54) SOLDERLESS METHOD FOR TRANSFERRING HIGH FREQUENCY, RADIO FREQUENCY SIGNALS BETWEEN PRINTED CIRCUIT BOARDS

(75) Inventors: Danny F. Ammar, Windermere, FL (US); Gavin Clark, Tavares, FL (US); Eugene Fischer, Clermont, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/647,681

(22) Filed: Aug. 25, 2003

(65) Prior Publication Data

US 2004/0067663 A1 Apr. 8, 2004

Related U.S. Application Data

(63) Continuation of application No. 10/224,622, filed on Aug. 20, 2002, now Pat. No. 6,625,881.
(60) Provisional application No. 60/318,732, filed on Sep. 11, 2001.

(51) Int. Cl.[7] .............................................. H01R 12/00
(52) U.S. Cl. ........................................ 439/65; 439/636
(58) Field of Search ............................. 439/65, 66, 91, 439/500, 591, 636, 638, 862

(56) References Cited

U.S. PATENT DOCUMENTS

| | | | |
|---|---|---|---|
| 3,706,954 A | * | 12/1972 | Krafthefer .................... 439/65 |
| 4,867,696 A | | 9/1989 | Demler, Jr. et al. |
| 4,890,199 A | | 12/1989 | Beutler |
| 5,053,926 A | | 10/1991 | Dickie |
| 5,129,832 A | | 7/1992 | Marsh et al. |
| 5,188,534 A | | 2/1993 | Bertho et al. |
| 5,239,127 A | | 8/1993 | Swikle et al. |
| 5,366,380 A | | 11/1994 | Reymond |
| 5,373,101 A | | 12/1994 | Barabolak |
| 5,595,490 A | | 1/1997 | Cohen et al. |
| 5,617,866 A | | 4/1997 | Marian, Jr. |
| 5,639,263 A | | 6/1997 | Zell et al. |
| 5,641,314 A | | 6/1997 | Broschard, III et al. |
| 5,748,455 A | | 5/1998 | Phillips et al. |
| 5,820,549 A | | 10/1998 | Marian, Jr. |
| 5,896,107 A | | 4/1999 | Huynh |
| 5,967,800 A | | 10/1999 | Bishop |
| 5,991,165 A | | 11/1999 | Jones, Jr. et al. |
| 6,025,806 A | | 2/2000 | Deininger et al. |
| 6,077,130 A | * | 6/2000 | Hughes et al. .............. 439/862 |
| 6,142,802 A | | 11/2000 | Berg et al. |
| 6,200,171 B1 | | 3/2001 | Fusselman et al. |

* cited by examiner

*Primary Examiner*—Tho D. Ta
*Assistant Examiner*—James R. Harvey
(74) *Attorney, Agent, or Firm*—Allen, Dyer, Doppelt, Milbrath & Gilchrist, P.A.

(57) ABSTRACT

A connector system and method for cooperating printed circuit boards includes a housing member having a clip receiving slot and circuit board engaging surface that is positioned against a first printed circuit board. At least one electrically conductive clip member has opposing ends and is received within the clip receiving slot. One end is readily secured by soldering to a circuit on the first printed circuit board and the other end is biased into connection with the circuit of a second printed circuit board such that high frequency radio frequency signals are transferred from one printed circuit board to the other printed circuit board via the clip member.

19 Claims, 2 Drawing Sheets

SOLDERLESS METHOD FOR TRANSFERRING HIGH FREQUENCY, RADIO FREQUENCY SIGNALS BETWEEN PRINTED CIRCUIT BOARDS

RELATED APPLICATION

This application is based upon prior filed provisional application Ser. No. 60/318,732 filed Sep. 11, 2001 and is a continuation of 10/224,622 filed Aug. 20, 2002 now U.S. Pat. No. 6,625,881.

FIELD OF THE INVENTION

This invention relates to the field of connectors for printed circuit boards and similar applications, and more particularly, this invention relates to the transfer of high frequency, radio frequency signals between cooperating printed circuit boards.

BACKGROUND OF THE INVENTION

Traditionally, high frequency radio frequency signals greater than about 500 MHz require subminiature coaxial connectors (SMA) that work in conjunction with connected coaxial cables for transferring signals between printed circuit boards or other components. Although these subminiature coaxial connectors are semi-precision, subminiature devices used with coaxial cables, including flexible and semi-rigid cabling, the types of connections required to make high frequency signal transfer adequate are relatively large and expensive.

Subminiature coaxial connectors operate at broadband frequencies and have low reflections. Many are designed to have a constant 50 Ohm impedance, making them advantageous for use in various applications in the microwave industry. Many different types of SMA connectors are available, but these connectors are large and expensive to use in some designs.

Some surface mount, pressure contact connectors have been designed for use in traditional DC signal connections, but usually never for transferring high frequency radio frequency signals (up to 4 GHz or more). Although some connectors have been used for transferring one of either DC signals or high frequency signals, such as disclosed in U.S. Pat. Nos. 5,188,534; 5,129,832; 5,595,490; and 5,991,165, adequate connection methods have not been known that allow the mixing of high frequency and DC signals on the same surface mount contact connector without impacting performance. It is also desirable if high frequency signals could be transferred with a solderless connection through a low cost, surface mount, spring or similar contact, while also allowing transfer of some DC signals. Additionally, many prior art connectors require solder connections at both ends, making assembly of the circuit boards and other component assemblies more difficult.

SUMMARY OF THE INVENTION

It is therefore an object of the present invention to provide a surface mount, pressure contact connector system that allows mixing of high frequency and DC signals without impacting performance.

It is another object of the present invention to provide a connector system between cooperating circuit boards that allows high frequency signals to be transferred with a solderless connection through a low cost, surface mount, spring or similar contact.

The present invention provides a connection method for connecting a pair of cooperating printed circuit boards and allowing high frequency, radio frequency signal transfer in a solderless connection to a second printed circuit board. It also permits DC signal transfer.

In accordance with the present invention, a housing member has a clip receiving slot and a circuit board engaging surface that is positioned against a first printed circuit board. At least one electrically conductive clip member that acts as a spring-like pin has opposing ends and is received within the clip receiving slot. One end of the clip member is readily secured by soldering to a circuit on the first printed circuit board. Another end of the clip member is biased into connection with a circuit of a second printed circuit board such that high frequency radio frequency signals are transferred from one printed circuit board to the other printed circuit board via the clip member.

In yet another aspect of the present invention, the connector system includes a plurality of housing members positioned adjacent to each other such that respective electrically conductive clip members are received within the housing members and positioned for interconnecting radio frequency signal lines, ground lines and DC signal lines that are formed on first and second printed circuit boards.

In yet another aspect of the present invention, the housing member is formed from plastic and is substantially rectangular configured. It includes a flat circuit board engaging surface that rests against the first circuit board. The electrically conductive clip member is substantially v-shaped and has a first leg member and an end that engages a circuit or trace on the first circuit board member. A second leg member includes an end that is spring biased against a circuit or trace on the second circuit board member. The end of the second leg member includes a bent contact forming a radius (concave) surface to aid in engaging a circuit on the second board member. The housing member includes a shoulder formed within each clip receiving slot that engages the second leg member to maintain a biasing force not only against the shoulder, but against the second circuit board to which it engages.

In yet another aspect of the present invention, a plurality of electrically conductive clip members that act as spring-like pins have opposing ends and are received within respective clip receiving slots. One end is readily secured by soldering to the circuit on the first printed circuit board and the other end is biased in connection with a circuit of a second printed circuit board. A clip member interconnects a radio frequency signal line and adjacent clip members interconnect ground lines and DC signal lines for transferring high frequency signals, ground connections and DC signals from one printed circuit board to the other printed circuit board via the clip members.

A method is also disclosed for connecting a pair of cooperating printed circuit boards and comprises the step of soldering to a circuit of a first printed circuit board an end of at least one electrically conductive clip member that is received within a clip receiving slot of a housing member having a circuit board engaging surface that rests against the first printed circuit board. The other end of the electrically conductive clip member is biased against the circuit of the second printed circuit board.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously uses a connection method which, in one aspect of the present invention, is a surface mount, pressure contact connector that transfers high frequency, radio frequency signals (up to 4 GHz or more) with very low losses. It also allows the mixing of high frequency and DC signals on the same surface mount, pressure contact connector without impacting performance. High frequency signals can be transferred with a solderless connection through a low cost, surface mount spring-type contact of the present invention.

Figure 1:
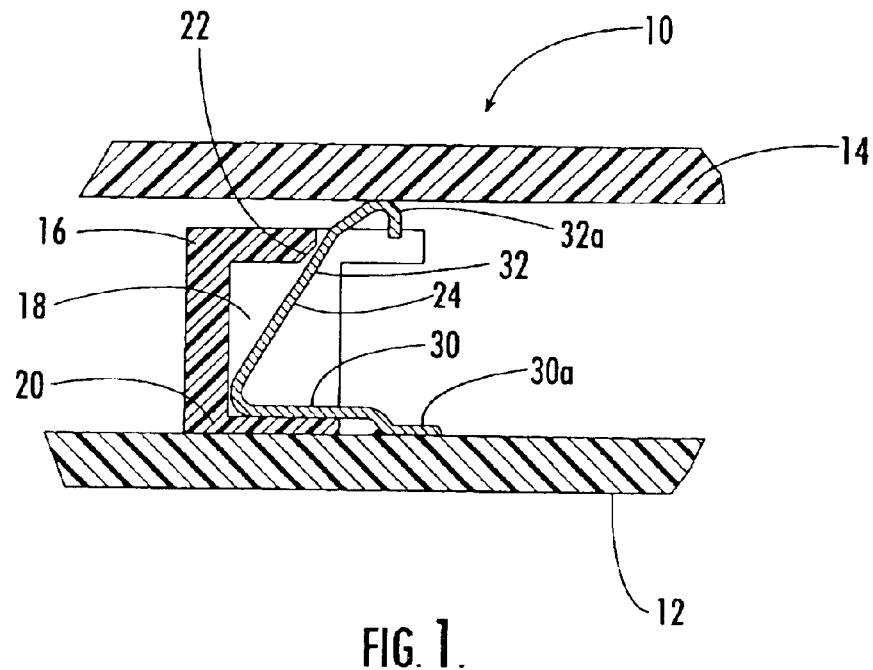
FIG. 1 is a fragmentary, sectional view of a surface mount, pressure contact connector of the present invention and showing a connection between a first and second printed circuit board.

FIG. 1 illustrates a portion of a surface mount, pressure contact connector 10 of the present invention that allows solderless connection between circuit boards. Some prior art connectors that act as spring-type pin or chip contacts have been used at low cost in the industry to transfer DC signals between stacked layers of printed circuit boards (PCB). For example, one type of DC connector has been used in cellular telephones. The present invention goes beyond DC signal transfer, and is an improvement over standard DC connectors because it allows high frequency, radio frequency signals to be transferred with a surface mount, pressure contact application.

Figure 2:
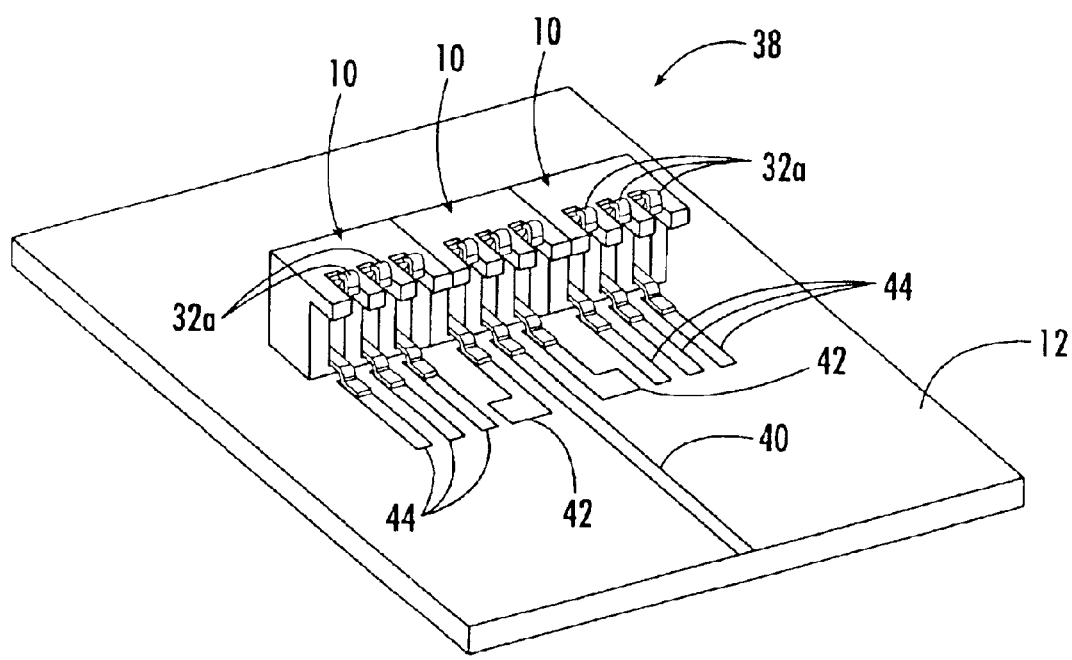
FIG. 2 is an isometric view illustrating a number of connectors positioned adjacent to each other on a first printed circuit board for forming a connection system of the present invention, where high frequency radio frequency signals, ground and DC signals are transferred between overlying, cooperating circuit boards.

As shown in the fragmentary, partial sectional view of FIG. 1, the connector 10 connects a pair of cooperating first and second printed circuit boards 12, 14, i.e., a first and second printed circuit board. The connector 10 includes a housing member 16 having a clip receiving slot 18 (also referred to as a pin receiving slot) and a circuit board engaging surface 20 that is positioned against the first printed circuit board 12. In one aspect of the present invention, each housing member 16 includes three clip receiving slots 18 as illustrated in FIG. 2, where three housing members 16 are shown adjacent to each other. The housing member 16 is preferably formed from plastic and is substantially rectangular configured and includes a substantially flat, circuit board engaging surface that rests prone against the flat surface of the printed circuit board. Each clip receiving slot 18 is formed as a rectangular cut-out and includes a shoulder 22 for engaging the electrically conductive clip members 24 as shown in FIG. 1.

Each clip member 24 is substantially v-shaped as shown in FIG. 1. The clip members 24 are small and can also be referred to as pins because of their small, spring-like and pin-like capacity to make "pin" connections. Each clip member 24 includes a first leg member 30 and end that engages the first printed circuit board 12. This end includes a drop down shoulder 30a that is soldered to a circuit trace or other circuit on the first printed circuit board 12. The upper portion of the first leg member 30 is received within the clip receiving slot 18. A second leg member 32 has an end that is spring biased against the second printed circuit board 14. The second leg member 32 includes a bent contact end 32a that forms what could be referred to as a "pin" or spring contact for engaging in a biased condition a circuit or trace on the second circuit board member. The leg member 32 engages the shoulder 22 in the clip receiving slot to maintain a biasing force or "spring-action" of the clip member against the shoulder, while also maintaining a biasing force against the second printed circuit board such that the pressure contact established by the bent end of the second leg member engages the circuit, trace or other connection point on the second printed circuit board. The second (or first) printed circuit board can have metallized pads that align with the connector "pins" formed by the clip member 24.

In one aspect of the invention where a number of connectors 10 form a connection system 38 as shown in FIG. 2 (the top or second printed circuit board is shown removed), a central clip member interconnects a radio frequency signal line 40 as a preferred 50 ohm impedance radio frequency signal line, known to those skilled in the art. Adjacent clip members 24 (or pins) interconnect ground lines 42 positioned on the opposing side of the radio frequency signal line 40. Although only one ground pin per side shown, the number of ground pins can be varied to increase isolation and improve return loss. Other adjacent clip members 24 (pins) connect DC and signal lines 44. Thus, the connector system 38 using the connectors 10 of the present invention can transfer not only high frequency signals, but also ground connections and DC signals from one printed circuit board 12 to the other printed circuit board 14 via the clip members forming the spring-like pin connections.

In one aspect of the present invention, the spacing between the clip members (or pins) is about 40 mils and DC signals could be carried on other clip members in the same connector.

Figure 3:
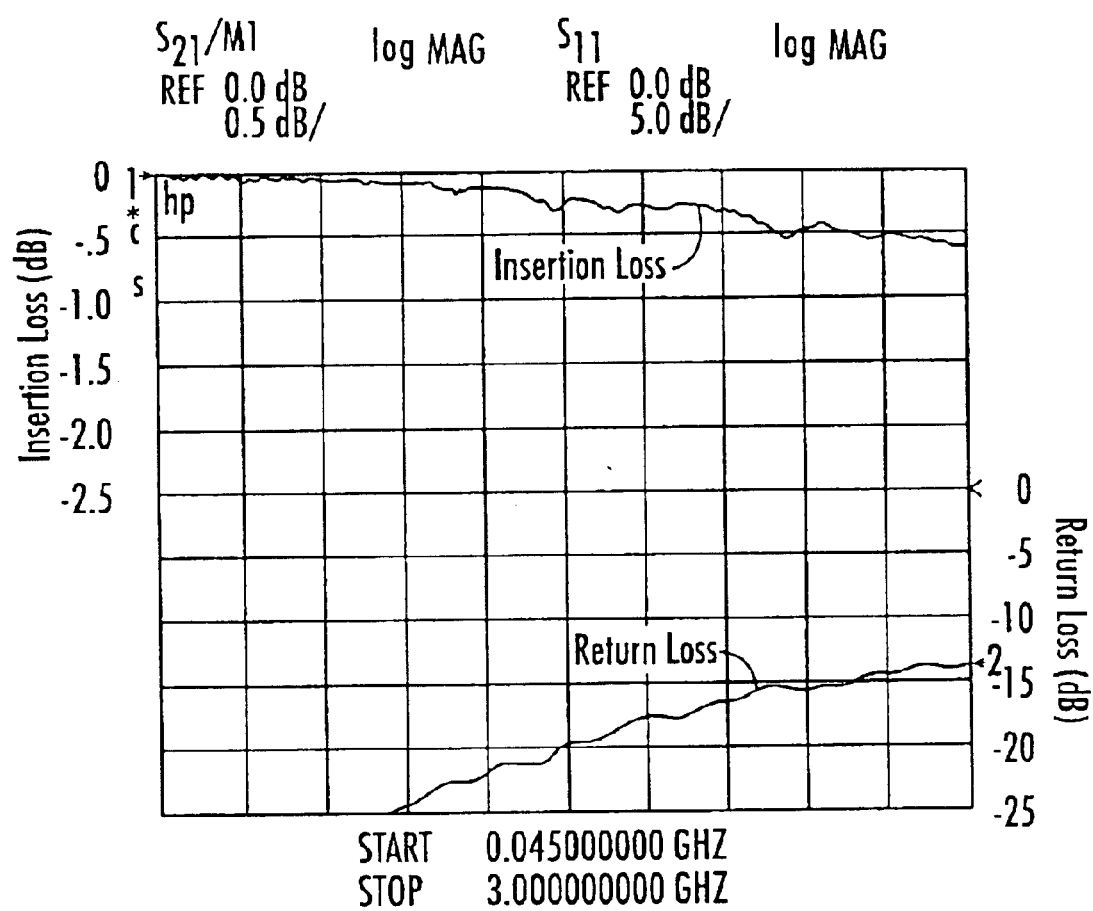
FIG. 3 is a graph showing the measured results for transferring radio frequency signals up to 3 GHz using the connector system shown in FIGS. 1 and 2.

FIG. 3 is a chart illustrating the measured results for transferring radio frequency signals up to 3 GHz using the contact connectors shown in FIG. 2. The insertion loss at 3 GHZ is about 0.5 dB and the return loss is approximately −14 dB. Other measurements show that this connector works reliably up to 4 GHz with less than 1 dB insertion loss and less than 10 dB return loss.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. A method for transferring radio frequency (RF) signals greater than about 500 MHz between first and second cooperating circuit boards, which comprises:

positioning a housing member against the first printed circuit board, said housing member including a plurality of clip receiving slots and a conductive clip member received within each clip receiving slot, each clip member including only opposing free ends that extend beyond the housing member which can make electrical contact such that one free end of each clip member engages circuits on the first printed circuit board;

biasing the other free end of each clip member into connection with a circuit of a second printed circuit board such that a center clip member interconnects a radio frequency (RF) signal line and adjacent clip members interconnect ground lines and other clip members adjacent to the ground lines interconnect DC signal lines;

transferring RF signals between the boards via the conductive clip member engaging RF signal lines; and transferring DC signals via the clip members interconnecting DC signal lines, and transferring ground connections via the clip members interconnecting ground lines such that the clip members interconnecting ground lines provide isolation and improve return loss.

2. A method according to claim 1, and further comprising the step of transferring ground signals using conductive clip members positioned on either side of the conductive clip member that transfers RF signals.

3. A method according to claim 1, and further comprising the step of soldering the end of the conductive clip member engaging the first printed circuit board.

4. A method according to claim 1, wherein the connector is solderless on at least one end.

5. A method according to claim 1, and further comprising the step of positioning a plurality of housing members adjacent to each other and transferring ground signals using conductive clip members positioned on either side of the conductive clip member that transfers RF signals.

6. A method according to claim 1, and further comprising the step of transferring RF signals at no less than 4 GHz.

7. A method according to claim 1, wherein the conductive clip member comprises one or more surface mount pressure contacts.

8. A method according to claim 1, and further comprising the step of mixing the RF signals with a carrier frequency for passing through a conductive clip member.

9. A method of transferring RF signals greater than about 500 MHz between first and second cooperating printed circuit boards comprising:

providing a conductive clip members that each have only two opposing ends for making electrical contact between two boards, without use of connecting wires between the boards such that the conductive clip member ends engage respective boards, wherein a center clip member interconnects a radio frequency (RF) signal line and adjacent clip members interconnect ground lines, and other clip member adjacent to the ground lines interconnect DC signal lines;

transferring RF signals between the boards via the conductive clip member engaging a RF signal line; and transferring DC signals via the clip members interconnecting DC signal lines, and transferring ground connections via the clip members interconnecting ground lines such that the clip members interconnecting ground lines provide isolation and improve return loss.

10. A method according to claim 9, and further comprising the step of transferring the RF signals at no less than 4 GHz.

11. A method according to claim 9, wherein the conductive clip member is solderless on at least one end.

12. A method according to claim 9, wherein the conductive clip member comprises one or more surface mount contacts.

13. A method according to claim 9, and further comprising the step of mixing the RF signals with a carrier frequency and/or other RF processing signals that add functionality.

14. A method according to claim 9, and further comprising the step of transferring ground signals using conductive clip members positioned on either side of the conductive clip member that transfers RF signals.

15. A connector system for transferring RF signals greater than about 500 MHz between first and second cooperating printed circuit boards, comprising:

a housing member having a plurality of clip receiving slots and a conductive clip member received in each clip receiving slot, wherein each conductive clip member includes only opposing free ends that extend beyond the housing member which can make electrical contact wherein one free end of a conductive clip member engages a circuit on the first printed circuit board and the other free end of a conductive clip member is biased into connection with a circuit of the second printed circuit board wherein a center clip member interconnects a radio frequency signal line and adjacent clip members interconnect ground lines, and other clip members adjacent to the ground lines interconnect DC signal lines such that RF signals are transferred via the conductive clip member interconnecting a RF signal line between the first and second printed circuit boards and DC signals are transferred via the clip members interconnecting the DC signal lines and ground connections are transferred via the clip members interconnecting ground lines such that the clip members interconnecting ground lines provide isolation and improve return loss.

16. A connector system according to claim 15, wherein said RF signals are transferred at frequencies no less that 4 GHz with very low losses.

17. A connector system according to claim 15, wherein the conductive clip member is solderless on at least one end.

18. A connector system according to claim 15, wherein the conductive clip member comprises one or more surface mount pressure contacts.

19. A connector system according to claim 15, wherein RF signals are mixed with a carrier frequency and/or RF processing signals.

* * * * *